United States Patent [19]
Sakamoto

[11] 3,753,172
[45] Aug. 14, 1973

[54] VARACTOR TUNING SYSTEM HAVING MEANS TO MAINTAIN TERMINAL VOLTAGE OF VARACTOR BIASING CAPACITOR WITHIN DESIRED RANGE

[75] Inventor: Yoichi Sakamoto, Toyonaka, Japan

[73] Assignee: Matsushita Electric Industrial Co. Ltd., Osaka, Japan

[22] Filed: Sept. 11, 1972

[21] Appl. No.: 287,919

[30] Foreign Application Priority Data

| | | |
|---|---|---|
| Sept. 14, 1971 | Japan | 46/71597 |
| Sept. 14, 1971 | Japan | 46/71598 |
| Sept. 14, 1971 | Japan | 46/71599 |

[52] U.S. Cl. .................... 334/15, 307/320, 325/422, 331/36 C, 334/16
[51] Int. Cl. .................... H03j 5/02, H03b 3/04
[58] Field of Search .................... 334/15, 16; 331/36 C; 307/271, 320; 325/422, 469

[56] References Cited

UNITED STATES PATENTS

| | | | |
|---|---|---|---|
| 3,631,349 | 12/1971 | Rhee | 334/15 X |
| 3,634,700 | 1/1972 | Worcester | 307/320 X |
| 3,706,041 | 12/1972 | Krausser | 334/16 X |

*Primary Examiner*—Paul L. Gensler
*Attorney*—Richard K. Stevens et al.

[57] ABSTRACT

A tuning system in which a tuning voltage is applied from a voltage holding circuit including a capacitor to a tuning circuit using a variable capacitance diode. When the terminal voltage across the capacitor is reduced, the capacitor is charged from a power supply through a switch to compensate the reduction. When the frequency of the tuning circuit is changed to a predetermined extent, the switch is closed to recover the initial level of the voltage of the voltage holding circuit.

6 Claims, 5 Drawing Figures

VARACTOR TUNING SYSTEM HAVING MEANS TO MAINTAIN TERMINAL VOLTAGE OF VARACTOR BIASING CAPACITOR WITHIN DESIRED RANGE

This invention relates to tuning systems for use in television receiver tuners.

FIG. 1 generally shows a usual automatic frequency control system (hereinafter referred to as AFC) of a television receiver. In the Figure, reference numeral 1 designates a received broadcast signal input terminal, numeral 2 a mixer, numeral 3 a local oscillator, numeral 4 an I-F amplifier, numeral 5 a demodulator and numeral 6 a frequency deviation detecting circuit. When the intermediate frequency deviates from a regular frequency due to variation of the free oscillation frequency of the local oscillator 3, the frequency deviation detecting circuit 6 detects the deviation and generates a control voltage. The ratio of the voltage generated to the extent of frequency deviation is represented as transmission constant $\mu$ (V/MHz). The control voltage is coupled to the local oscillator 3 to correct the oscillation frequency thereof at a ratio given as feedback constant $\beta$ (MHz/V). In this manner, the local oscillator frequency and intermediate frequency are automatically controlled to the regular frequency.

In the above AFC system, it has heretofore been proposed to use a variable capacitance diode as one of the tuning elements of the local oscillator 3 and a capacitor as means to provide a bias voltage to the variable capacitance diode, whereby when switching channels the capacitor is charged to a voltage corresponding to a frequency of the selected channel, the terminal voltage of the charged capacitor being subsequently used as the tuning voltage. In such a system, however, with gradual discharging of the capacitor the terminal voltage thereacross is gradually reduced. Therefore, the controlled frequency gradually varies and eventualy gets out of the reception band to disable the reception.

An object of the invention is to prevent the frequency of the tuning circuit from being excessively deviated.

According to the invention, when the frequency of the tuning circuit is deviated to a predetermined frequency due to discharging of the capacitor, the capacitor is re-charged, thus preventing the frequency of the tuning circuit from deviating beyond the predetermined frequency.

In order for the invention to be fully understood, it will now be described in connection with the accompanying drawings, in which.

Figure 2:
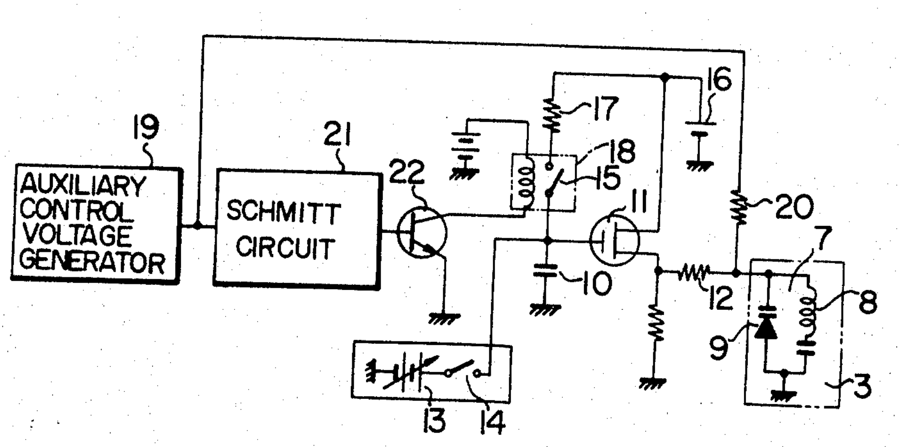
FIG. 2 is a schematic representation of an embodiment of an automatic frequency control system according to the invention.

Referring now to FIG. 2, which shows one embodiment of the invention, reference numeral 7 designates a tuning circuit of the local oscillator 3. It consists of a coil 8 and a variable capacitance diode 9, and its tuning frequency is controlled by varying a reverse bias voltage applied to the variable capacitance diode 9.

Numeral 10 designates a capacitor, whose terminal voltage is used to provide a main control voltage to the variable capacitance diode 9. The capacitor has its one terminal connected to ground and its other terminal connected to the gate of a field-effect transistor 11 (hereinafter referred to as FET), which is connected as a source follower to provide high input impedance. The main control voltage is supplied from the source of the FET 11 through a resistor 12 to the variable capacitance diode 9.

Numeral 13 designates a main control voltage generator. When channels are switched, it provides the main control voltage for impression on the variable capacitance diode 9 so as to bring the oscillation frequency of the local oscillator 3 into a proximity for frequency required to receive the selected channel (more exactly into within a pull-in frequency range to be described hereinafter). At this time, the capacitor 10 is charged by the voltage from the main control voltage generator 13, whose switch 14 is opened after the charging.

The main control voltage to be impressed on the capacitor 10 for charging thereof may, for instance, be produced by using two oscillators, with which frequencies are swept successively to higher frequencies in intermittent sweep periods according to a sweep voltage. In this case, the frequency interval swept in one sweep period is made equal to the channel bandwidth, and the sweeping is started from the carrier frequency of the lowest frequency channel in the broadcast band. By detecting that the sweeping has been done for a desired number of sweep periods, the sweeping operation of one of the oscillators is stopped, and the sweep voltage at this instant is used as the main control voltage.

Numeral 18 designates a relay having a switch 15, which is inserted in series with a resistor 17 between a power supply 16 and the connection point between the capacitor 10 and the gate of the FET 11. When the terminal voltage across the capacitor 10 is reduced due to discharging thereof to a certain level, the switch 15 is closed to make the capacitor 10 be gradually re-charged by the power supply 16 through the resistor 17 providing a high resistance. When the capacitor 10 is charged to a predetermined level, the switch 15 is opened.

Figure 1:
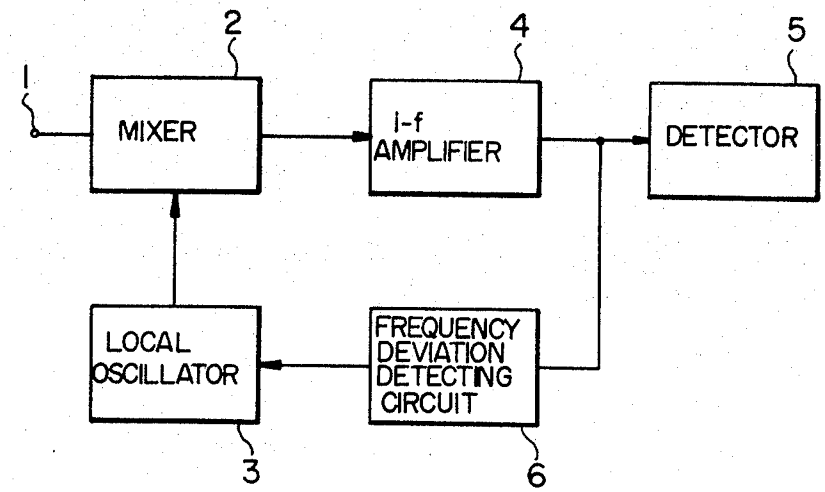
FIG. 1 PRIOR ART
FIG. 1 is a block diagram showing the aforementioned general automatic frequency control system.

Numeral 19 designates an auxiliary control voltage generator (AFC voltage generator) corresponding to the frequency deviation detecting circuit 6 shown in FIG. 1. When the output frequency of the I-F amplifier deviates from the regular I-F frequency, the auxiliary control voltage generator 19 produces an auxiliary control voltage, which is coupled through a resistor 20 to the variable capacitance diode 9 in superimposition upon the main control voltage so as to correct the I-F amplifier output frequency to the regular frequency.

Numeral 21 designates a Schmitt circuit having a preset hysteresis characteristic. It is controlled by the auxiliary control voltage output of the auxiliary control voltage generator 19, and its output is used to on-off control a transistor 22 so as to control the relay 18. In this way, when the terminal voltage across the capacitor 10 is reduced to a certain level, the switch 15 of the relay 18 is closed to re-charge the capacitor 10, whereby the terminal voltage across the capacitor 10 can always be held within a constant range for the I-F frequency stabilization.

Figure 3:
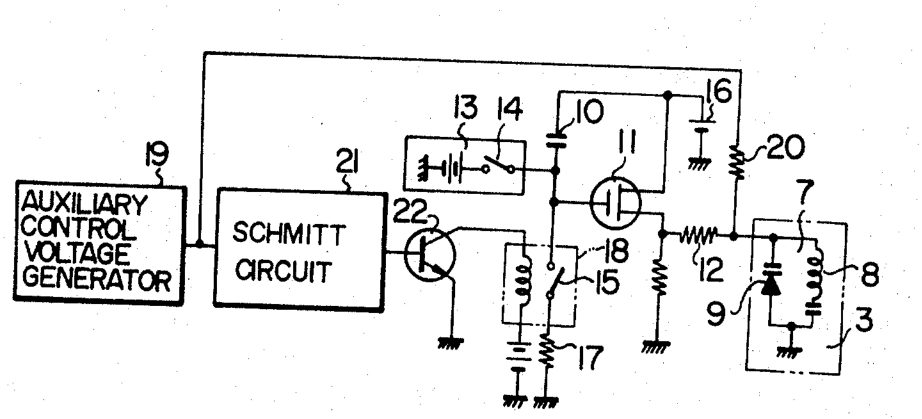
FIG. 3 is a schematic representation of another embodiment of the automatic frequency control system according to the invention.

FIG. 3 shows a modification of the above embodiment. It is the same as the above embodiment except that the capacitor 10 to be charged with the main control voltage is connected between the gate and drain of the FET 11, so corresponding parts to those in FIG. 2 are designated by like reference numerals and are not described.

Figure 4:
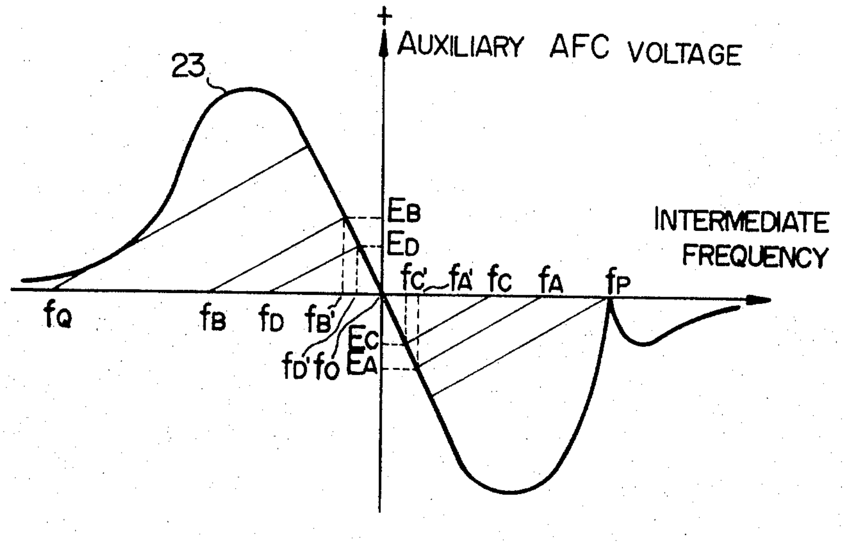
FIG. 4 is a graph for explaining the operation of the embodiment of FIG. 2.

The operation of the embodiment of FIG. 2 will now be described with reference to FIG. 4. In FIG. 4, the ordinate is taken for auxiliary control voltage and the abscissa for intermediate frequency. An S-shaped curve indicated at 23 represents and auxiliary control voltage versus controlled intermediate frequency characteristic. A frequency $f_O$ is the regular frequency, which usually corresponds to 58.75 MHz in Japan. Frequencies $f_P$ and $f_Q$ correspond to the respective upper and lower limits of an I-F range capable of being pulled-in. The frequency $f_P$ is set to $f_O + 1.5$ MHz in view of the sound trap in the adjacent channel. Inclined straight lines shown have a positive slope of $1/\beta$, and a central portion (substantially straight portion) of the S-shaped curve has a slope of $\mu$.

The pull-in range of the auxiliary control voltage generating circuit 19 is set to between $f_A$ and $f_B$ within the range between $f_P$ and $f_Q$. The terminal voltage across the capacitor 10 is preset such that the intermediate frequency that is to be controlled, that is, the intermediate frequency corresponding to the free oscillation frequency of the local oscillator 3 immediately after charging of the capacitor by the main control voltage generator 13 is a frequency $f_C$ between frequencies $f_A$ and $f_B$.

When channels are switched, the capacitor 10 is charged. Immediately after the switch 14 is opened, the variable capacitance diode 9 in the tuning circuit 7 of the local oscillator 3 is controlled by the terminal voltage across the capacitor 10 so that the free oscillation of the local oscillator 3 takes place to provide the intermediate frequency $f_C$. Simultaneously with the oscillation, the auxiliary control voltage generator 19 detects the deviation of the intermediate frequency $f_C$ from the regular intermediate frequency $f_O$, thereby producing an auxiliary control voltage for impression upon the variable capacitance diode 9 in superimposition upon the main control voltage to correct the local oscillator frequency so as to obtain a stable operation with an auxiliary control voltage $E_O$ and at an intermediate frequency $f_C'$.

The terminal voltage across the capacitor 10, however, reduces, although gradually, due to natural discharging of the capacitor 10 or discharging thereof through the input impedance of the FET 11. Thus, the main control voltage applied to the variable capacitance diode 9 is gradually reduced to gradually lower the intermediate frequency $f_C$ corresponding to the free oscillation of the local oscillator 3. From this reason, the intermediate frequency corresponding to the free oscillation frequency is lowered from $f_C$ to $f_D$ and then to $f_B$. As a result, the auxiliary control voltage is gradually increased from $E_C$ to $E_D$ and then to $E_B$, so that the controlled intermediate frequency is lowered from $f_C'$ to $f_D'$ and then to $f_B'$. Since it is possible to make the intermediate frequency range between $f_A'$ and $f_B'$ sufficiently small, there is no problem in the reception.

The terminal voltage across the capacitor 10 is further reduced with further discharging thereof, and with this reduction in the terminal voltage across the capacitor 10 the free oscillation frequency of the local oscillator 3 is further lowered. If the free oscillation frequency is lowered excessively, the corresponding intermediate frequency becomes lower than the lower limit $f_B$ set for the auxiliary control voltage generator 19. In such a case, the frequency control would be lost. Accordingly, the Schmitt circuit 21 which is controlled by the auxiliary control voltage is set such that it is switched when the auxiliary control voltage is reduced to $E_B$. By so doing, when the terminal voltage across the capacitor is reduced to a certain level, that is, a level at which the intermediate frequency corresponding to the free oscillation frequency is $f_B$, the Schmitt circuit 21 is switched to trigger the transistor 22, thus causing current flowing through the relay 18 to close the switch 15 thereof, so that the capacitor 10 can be gradually charged by the power supply 16 through the switch 15 and high resistance 17. By gradually increasing the terminal voltage across the capacitor 10 in the above manner, the main control voltage impressed on the variable capacitance diode 9 of the local oscillator 3 can be gradually increased to gradually raise the corresponding intermediate frequency from $f_B$ toward $f_A$. Further, the auxiliary control voltage produced by the auxiliary control voltage generator 19 can be reduced from $E_B$ toward $E_A$, so that the controlled intermediate frequency can be gradually raised from $f_B'$ toward $f_A'$.

The Schmitt circuit 21 has a hystersis characteristic. More particularly, a control voltage for switching the Schmitt circuit 21 from the "off" state into the "on" state does not usually coincide with a voltage for switching the Schmitt circuit 21 from the "on" state into the "off" state, but the former voltage is higher than the latter. This characteristic is utilized, and the Schmitt circuit 21 is designed such that it is switched off when the intermediate frequency corresponding to the free oscillation frequency of the local oscillator 3 is raised to the upper limit $f_A$ with increase in the terminal voltage across the capacitor 10. By so doing, when the upper limit $f_A$ is reached the transistor 22 is cut off, so that the current flowing through the relay 18 vanishes to open the switch 15, thus interrupting the charging of the capacitor 10. In this way, the possibility of supercharging the capacitor 10 beyond the working range of the auxiliary control voltage generator 19 is eliminated. And the controlled intermediate frequency can be raised up to $f_A'$. Upon interruption of the charging of the capacitor 10, it again starts to be discharged, and its terminal voltage starts to be reached. This sequence is repeated.

With the switching circuit such as the Schmitt circuit 21 having a hysteresis characteristic and preset to be switched by two different switching control voltages within the auxiliary control voltage range between $E_A$ and $E_B$ defining the working range between $f_A$ and $f_B$ of the auxiliary control voltage generator 19, the charging of the capacitor 10 can be controlled such that it is started when the terminal voltage across the capacitor 10 is reduced to a preset voltage and is ended when the terminal voltage is increased to another preset voltage, as mentioned earlier. In this way, the free oscillation frequency of the local oscillator 3 can be maintained within the working range of the auxiliary control voltage generator 19, and the controlled intermediate frequency will swing over the narrow range between $f_B'$ and $f_A'$.

In case of applying the above automatic frequency control system to color television receivers, where the intermediate frequency is allowed to vary between about +80 kHz and −150 kHz, $f_A'$ and $f_B'$ may be set to the regular intermediate frequency plus 80 kHz and regular intermediate frequency minus 150 kHz, respectively, so that the upper and lower limits $f_A$ and $f_B$ of the intermediate frequency to be controlled are determined according to characteristic of the auxiliary control voltage generator 19. Thus, by roughly predetermining the free oscillation frequency of the local oscillator 3 so that the intermediate frequency $f_C$ corresponding to the free oscillation comes between $f_A$ and $f_B$, and according to this predetermination by approximately setting the voltage of the main control voltage generator 13 for charging the capacitor 10, the controlled intermediate frequency can be maintained within the afore-mentioned allowable range between $f_A'$ and $f_B'$ unless an accident takes place, so that the correct reception state can be maintained for a long period of time.

The way of variation of the gradually varying terminal voltage across the capacitor 10, variation of the free oscillation frequency mainly controlled by the terminal voltage across the capacitor 10 and variation of the stabilized intermediate frequency further controlled by the auxiliary control voltage generated from the auxiliary control voltage generator 19 will now be considered. Assuming the allowable range of variation of the stabilized intermediate frequency to be several tens kHz, this range corresponds to a range of variation of about 1.5 MHz of the free oscillation frequency of the local oscillator 3, although it depends upon the characteristic of the auxiliary control voltage generator 19. In usual television receivers, the rate of change of the free oscillation frequency of the local oscillator 3 of the tuner with respect to the control voltage applied to the variable capacitance diode 9 is about 20 MHz/V for UHF tuners and about 6 MHz/V at most for VHF tuners. Regarding the resistance value of a path contributing to discharging of the capacitor 10, as large as $10^{14}$ ohms may be obtained as the gate input resistance of the MOS FET 22, and about $10^{13}$ to $10^{14}$ ohms may be obtained as the resistance between contacts of the switch 15 of the relay 18 (assuming a mechanical switch). Compared to these resistances the insulation resistance of the capacitor 10 is far low; for instance its rating is about $10^{11}$ ohms in case of a polypropylene film capacitor of 0.1 microfarad. Thus it is safe to consider that the variation of the free oscillation frequency of the local oscillator, that is, the variation of the terminal voltage across the capacitor 10 due to discharging thereof, almost solely depends upon this insulation resistance of the capacitor 10. The discharging current I in the capacitor 10, capacitance C thereof and time rate of change of the terminal voltage $dV/dt$ are related as $$I = C\,dV/dt.$$

Assuming the capacitance of the capacitor 10 to be equal to 10 microfarad, the initial terminal voltage equal to 10 volts, the insulation resistance equal to $10^{11}$ ohms, an allowable range of variation of the free oscillation frequency equal to 1.5 MHz, the rate of change of the free oscillation frequency to the control voltage for UHF tuners equal to 20 MHz/V, and the rate of change of the free oscillation frequency to the control voltage for VHF tuners equal to 6 MHz/V, the time required for variation of the free oscillation frequency by 1.5 MHz are, from the above equation, about 1.25 minutes for the UHF tuner and about 4.2 minutes for the VHF tuner. During this period of variation of the free oscillation frequency, the intermediate frequency correspondingly varies by several tens kHz as mentioned earlier as the variation of the free oscillation frequency is corrected by the auxiliary control voltage generator 19. This variation of the intermediate frequency takes 1.25 to 4.2 minutes, so that its effect on the screen cannot be recognized by human eyes. In case of charging the capacitor 10 by the power supply 16 through the resistor 17 by closing the switch 15, substantially the same rate of change of intermediate frequency may be obtained if the resistance of the resistor 17 is set to be substantially equal to the insulation resistance of the capacitor 10. If the resistance of the resistor 17 is set lower (to the order of 1 to 2 places) than the insulation resistance of the capacitor 10, the effect of variation of the intermediate frequency at the time of charging of the capacitor 10 also will not be recognized by human eyes. Further, the time rate of change of the intermediate frequency may be reduced by prolonging the discharging and charging periods of the capacitor 10 by suitable means, for instance through detection of the terminal voltage across the capacitor 10 to provide a feedback.

Figure 5:
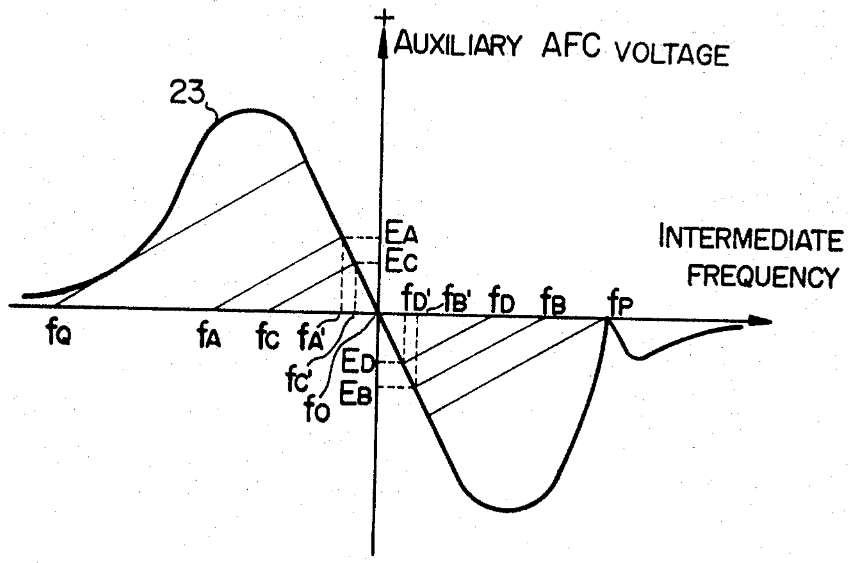
FIG. 5 is a graph for explaining the operation of the embodiment of FIG. 3.

The operation of the embodiment of FIG. 3 can be explained with reference to FIG. 5. However, it is basically the same as the operation of the first embodiment, with the only difference that the frequency charges conversely in the second embodiment, so it will not be described any further.

As has been described in the foregoing, according to the invention voltage variation in voltage holding means such as a capacitor for the main control is detected, and when it is reduced to a predetermined level it is re-increased through the action of a switching circuit having a hysteresis characteristic. Thus, the following effects can be obtained:

1. Since the voltage of the voltage holding means is maintained within a constant range, it is possible to maintain the tuning frequency within a constant range. Also, since the frequency control is done by the auxiliary control voltage of the auxiliary control voltage generator, it is possible to limit the variation of the tuning frequency within a small range for a long period of time, thus providing for steady reception state.

2. Since the main control voltage of the voltage holding means is always applied to a variable voltage reactance element, the reception state continues even if the external broadcast wave is temperarily interrupted, and when the braodcast wave is received again the previous state can be recovered by the action of the auxiliary control voltage generator for steady reception.

What is claimed is:

1. A tuning system conprising a tuning circuit using a variable capacitance diode as a tuning element, a voltage holding circuit including a capacitor for giving a tuning voltage to said variable capacitance diode, a power supply to compensate reduction in the voltage of said voltage holding circuit, a switching means provided between said power supply and said voltage holding circuit, a control means for on-off controlling said switching means, and a drive means detecting the frequency change in said tuning circuit and adapted to drive said control means so as to render said switching means into the "on" state when a predetermined extent of frequency change is detected.

2. The tuning system according to claim 1, wherein said voltage holding circuit further includes a field-effect transistor, said capacitor being connected between the gate of said field-effect transistor and ground, the source of said field-effect transistor being connected to said variable capacitance diode of said tuning circuit, the terminal of said capacitor on the field-effect transistor side being connected through said switching means to said power supply, said control means comprises a Schmitt circuit providing switching voltages for on-off controlling said switching means, and said drive means comprises a frequency deviation detecting circuit detecting the deviation of the frequency of said tuning circuit and generates a voltage corresponding to the detected deviation, the voltage corresponding to the detected frequency deviation being used to on-off control said Schmitt circuit.

3. The tuning system according to claim 1, wherein said voltage holding circuit further includes a field-effect transistor, said capacitor being connected between the gate and drain of said field-effect transistor, the source of said field-effect transistor being connected to said variable capacitance diode of said tuning circuit, said switching means being inserted between the terminal of said capacitor on the field-effect transistor gate side and ground, said power supply being connected between the terminal of said capacitor on the field-effect transistor drain side and ground, said control means comprises a Schmitt circuit providing switching voltages for on-off controlling said switching means, and said drive means comprises a frequency deviation detecting circuit detecting the deviation of the frequency of said tuning circuit and generates a voltage corresponding to the detected deviation, the voltage corresponding to the detected frequency deviation being used to on-off control said Schmitt circuit.

4. The tuning system according to claim 1, wherein said drive means comprises a frequency deviation detecting circuit detecting the deviation of the frequency of said tuning circuit and generating a voltage corresponding to the detected deviation, the voltage corresponding to the detected frequency deviation being used to drive said control means while it is applied as AFC voltage to said variable capacitance diode.

5. The tuning system according to claim 1, wherein said voltage holding circuit further includes a field-effect transistor having the gate thereof connected to said capacitor, the terminal of said capacitor on the field-effect transistor side being a voltage impression terminal, the source of said field-effect transistor being connected to a voltage impression terminal of said tuning circuit.

6. The tuning system according to claim 5, wherein said switching means is connected to the terminal of said capacitor on the field-effect transistor gate side, said switching means having a high resistance element connected in series therewith.

* * * * *

UNITED STATES PATENT OFFICE
CERTIFICATE OF CORRECTION

Patent No. 3,753,172 Dated August 14, 1973

Inventor(s) Yoichi SAKAMOTO

It is certified that error appears in the above-identified patent and that said Letters Patent are hereby corrected as shown below:

Column 3, lines 23-25: Delete "The pull-in range of the auxiliary control voltage generating circuit 19 is set to between $f_A$ and $f_B$ within the following range between $f_p$ and $f_Q$" and insert the following:

--The pull-in range extends from the frequency $f_p$ to the frequency $f_Q$. The frequency range from $f_A$ to $f_B$ is determined by the hysterisis voltage of the Schmitt circuit--.

Column 3, line 47, "$E_o$" should read -- $E_c$ --.

Column 4, line 4, after "set for" insert -- the output of --.

Signed and sealed this 17th dau of September 1974.

(SEAL)
Attest:

McCOY M. GIBSON, JR.
Attesting Officer

C. MARSHALL DANN
Commissioner of Patents

FORM PO-1050 (10-69)

USCOMM-DC 60376-P69
☆ U.S. GOVERNMENT PRINTING OFFICE : 1969 O—366-334.